United States Patent [19]
König

[11] Patent Number: 5,319,327
[45] Date of Patent: Jun. 7, 1994

[54] IF CRYSTAL FILTER HAVING A SELECTIVELY ADJUSTABLE FREQUENCY RESPONSE

[75] Inventor: Matthias König, Taunusstein, Fed. Rep. of Germany

[73] Assignee: Motorola, Inc., Schaumburg, Ill.

[21] Appl. No.: 931,181

[22] Filed: Aug. 17, 1992

[30] Foreign Application Priority Data

Aug. 24, 1991 [GB] United Kingdom ............... 9118297

[51] Int. Cl.⁵ .............................................. H03H 9/60
[52] U.S. Cl. .................................... 333/188; 333/192
[58] Field of Search ................ 333/186, 188, 190, 192

[56] References Cited

U.S. PATENT DOCUMENTS

| | | | |
|---|---|---|---|
| 3,588,756 | 6/1971 | Roylance | 333/188 |
| 3,633,134 | 1/1972 | Barrows | 333/192 |
| 4,323,866 | 4/1982 | Inoue | 333/188 |
| 4,818,959 | 4/1989 | Katoh | 333/192 X |

FOREIGN PATENT DOCUMENTS 769707 10/1980 U.S.S.R. ............................... 333/188

Primary Examiner—Benny Lee
Attorney, Agent, or Firm—Gary J. Cunningham; Joseph P. Krause; Timothy W. Markison

[57] ABSTRACT

An IF crystal filter for a VHF receiver including:

a crystal filter (18) having an input (22) and an output (24)

a reactive impedance means (26) coupled across the crystal filter input and output for changing the selectivity characteristics of the crystal filter by a predetermined amount; and switching means (32) having a control input responsive to a control voltage, and coupled to said reactive impedance means for selectively shunting the reactive impedance means to ground, whereby to change the selectivity of the filter.

8 Claims, 4 Drawing Sheets 5,319,327

IF CRYSTAL FILTER HAVING A SELECTIVELY ADJUSTABLE FREQUENCY RESPONSE

FIELD OF THE INVENTION

This invention relates to crystal filters for IF (intermediate frequency) applications in radio receivers.

BACKGROUND ART

In modern mobile and portable VHF receivers, with IF's in the region of 10 Mhz to 100 MHz for example, with closely spaced channels, the requirements for highly selective IF filters with a good dynamic range are very stringent.

In particular one requirement is that a receiver should be able to work with two different channel spacings, 25 kHz and 12.5 kHz for example.

It has long been realized that crystal filters are particularly useful as IF filters, since they have a very high and stable Q value. While it would be possible to selectively switch into the IF path two separate crystal filters, each specifically designed for one channel spacing, this is an expensive solution, since crystal filter are expensive, and would require additional space in the radio.

SUMMARY OF THE INVENTION

It is an object of the invention to provide an IF filter which can work with two separate channel spacings, but which is inexpensive.

The present invention to provide an IF filter which a radio receiver, including:

a crystal filter having an input and an output, a reactive impedance means coupled across the crystal filter input and output for changing the selectivity characteristics of the crystal filter by a predetermined amount, and switching means having a control input responsive to a control voltage, and coupled to said reactive impedance means for enabling the reactive impedance means to change the selectivity characteristics of the crystal filter.

As preferred, the reactive impedance means comprises a network of first and second impedances, such as a pair of capacitors (so called gimmick capacitors) or inductors, having their connecting node coupled via the switching means to ground/reference potential.

As preferred the switching means comprises a PIN diode controlled by a control voltage which switches between 0 and 5 V, to provide a variable impedance path to ground.

In a further embodiment, a further capacitor is connected to the switching means and the gimmick capacitors to improve selectivity even when the control voltage is 5 V.

As preferred a second IF crystal filter may be provided in cascade in the serial path, and isolated from the first filter by a buffer amplifier. The second filter improves the selectivity characteristics of the overall IF path. The second filter may if desired include in addition the selectivity switching arrangement of the present invention.

BRIEF DESCRIPTION OF THE DRAWINGS

Preferred embodiments of the present invention will now be described with reference to the accompanying drawings, wherein.

DESCRIPTION OF THE PREFERRED EMBODIMENT

Figure 1:
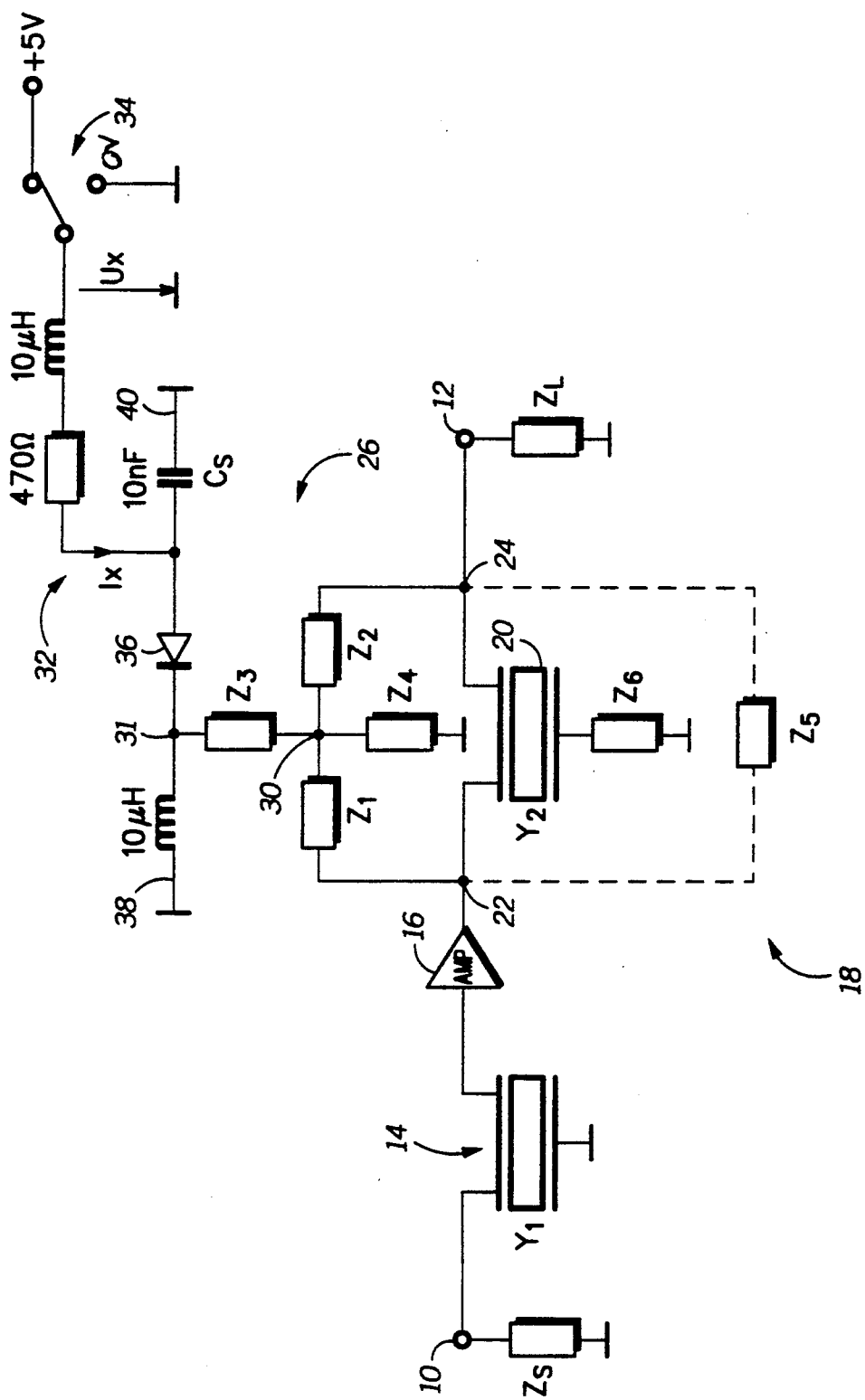
FIG. 1 is a circuit diagram of an IF filter according to the present invention.

Referring now to FIG. 1 of the drawings, there is shown an IF filter system for a hand held portable transceiver having an IF frequency of 45 Mhz and working on two different channel spacings of 25 kHz and 12.5 kHz.

The filter system has an input port 10 and an output port 12 and a first crystal filter 14 comprising a standard 2 pole crystal filter having a fundamental resonance frequency of 45 Mhz.

Figure 3:
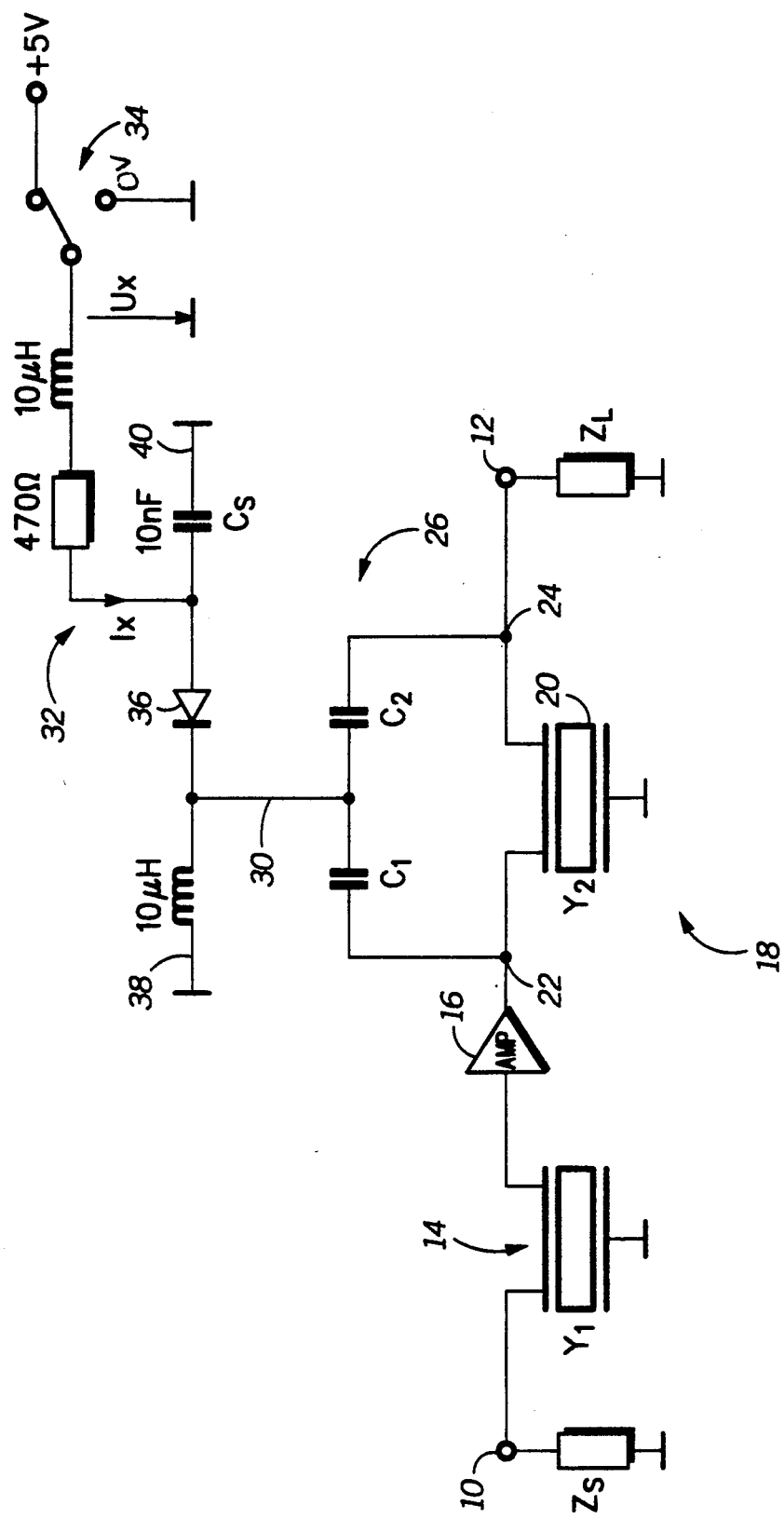
FIG. 3 is a circuit diagram of an IF filter according to a second embodiment.
Figure 4:
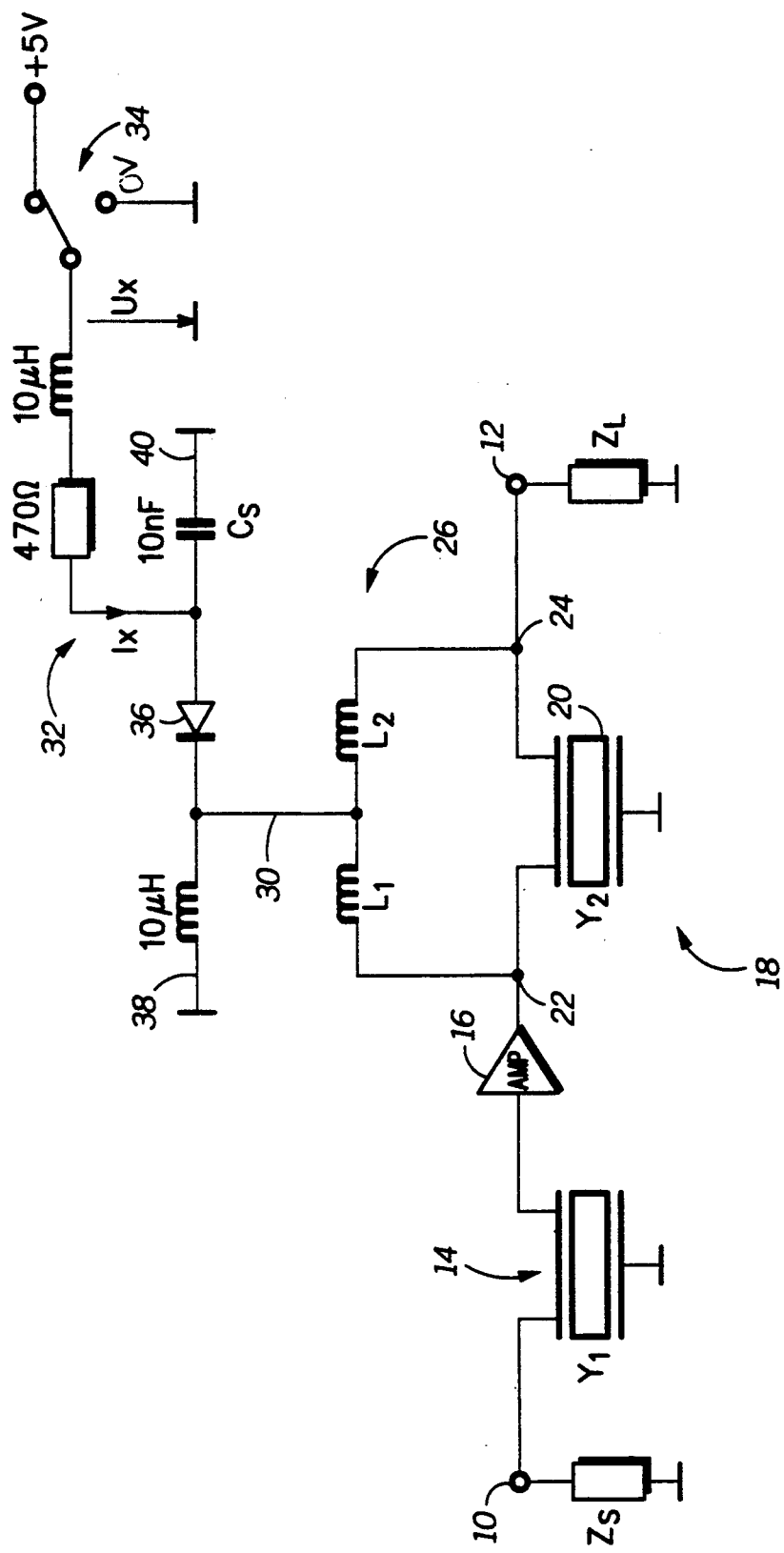
FIG. 4 is a circuit diagram of an IF filter according to a third embodiment.

Filter 14 is coupled via a buffer amplifier 16 to a second crystal filter 18 having a standard crystal 20 of the same type as that employed in filter 14, namely a 2 pole filter having a fundamental resonance of 45 Mhz. This filter has input and output ports 22, 24, and a reactive impedance network 26 coupled across the input and output ports. The impedance network 26 comprises first and second impedances Z1 and Z2 coupled between the input and output ports 22, 24. The first and second impedances Z1 and Z2 may be separate capacitors C1 and C2 having values of 2.2 pF (so called "gimmick" capacitors) as shown in FIG. 3 (like components to those of FIG. 1 are referred to by the same reference number) or first and second inductors L1 and L2 as shown in FIG. 4 (like components to those of FIG. 1 are referred to by the same reference number). The nodal connection 30 between first and second impedances Z1 and Z2 is coupled to a switching means or network 32. Y1 forms the characteristic of the second crystal (14), while ZS and ZL form the input and output characteristics, respectively, of the IF crystal filter system.

Network 32 comprises a control input 34 for receiving a switching control voltage $U_x$ of $0/+5$ V. Input 34 is coupled via an inductance of 10 μH and a resistance of 470Ω (for example) to a switch 36, such as a PIN diode, which is coupled between nodal point 31 and reference ground via a first path 38 including a 10 μH inductance and a second path 40 including a 10 nF capacitor $C_S$.

Figure 2A:
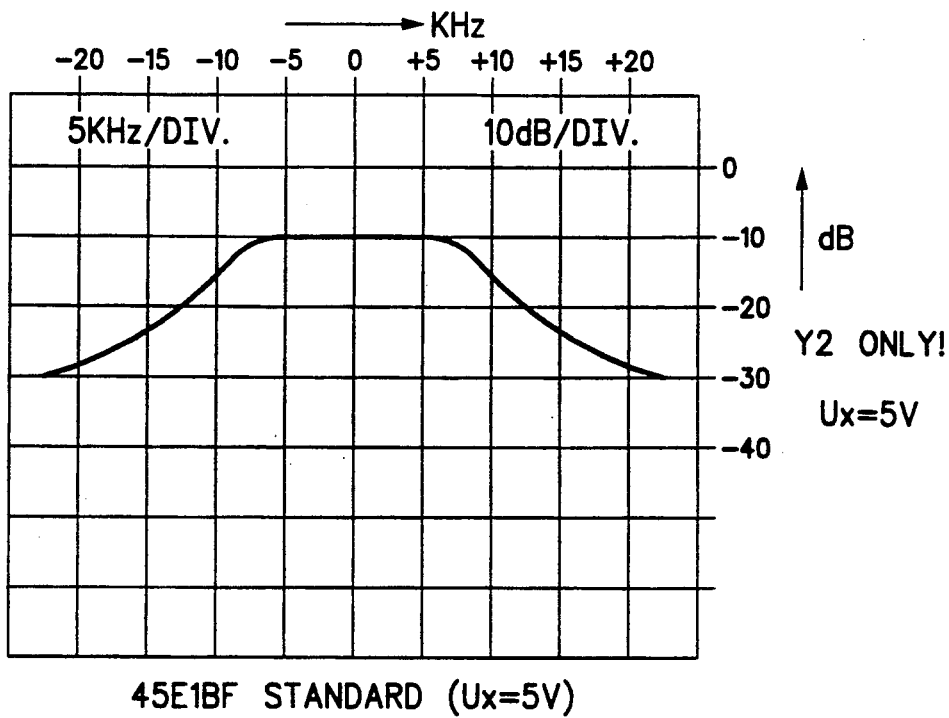
FIGS. 2A and 2B are graphs drawing the transfer function of the filter under different switching conditions.

In operation, the embodiment uses two DC voltages (0 V and 5 V, for example) to switch between two different states of bandwidth/selectivity by using standard monolithic crystal filter 20. As shown in the circuit diagram with $U_x = +5$ V applied to the switching network 32 the PIN diode 36 impedance is around 0Ω and both first and second impedances Z1 and Z2 are shunted to ground via the shunt capacitor $C_S$ of 10 nF (if Z3=0Ω). Now the impedance Z1 is in parallel to the input impedance of the crystal filter 20 and the other impedance Z2 is in parallel to the output impedance of crystal filter 20. In this case the crystal filter 18 is working as a standard filter meeting its original specifications with standard (wide) bandwidth and selectivity as shown in FIG. 2A.

If now $U_x$ is switched to 0 V (GND), the impedance of the PIN diode is high and both first and second impedances Z1 and Z2 are working in a series configuration. Thus, if two gimmick capacitors of 2.2 pF are used for the first and second impedances Z1 and Z2, a gimmick capacitor of about 1.1 pF from the input of Y2 to its output is provided.

Figure 2B:
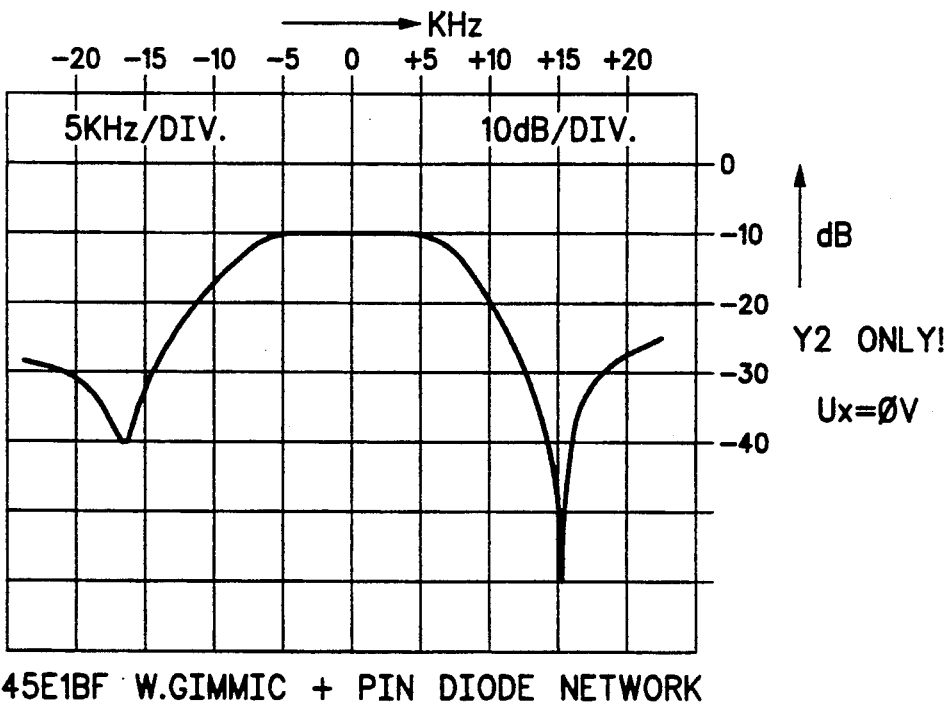

In this case as shown in FIG. 2B the bandwidth has changed to a smaller (narrow) bandwidth and selectivity is improved in the nearby frequency range (adjacent channel). It will be understood FIGS. 2A and 2B show the characteristic for filter 18 alone.

To achieve improved course selectivity, an additional (equal) standard crystal filter 14 including a buffer amplifier 16 is provided (which would be required anyway) if no other additional selectivity is provided. Filter 14 has the effect of sharpening the selectivity response.

Using crystal filters 14 and 18 as shown in the circuit diagram good selectivity and optimized bandwidth is provided for standard applications, like in 25 kHz channel spacing systems (for example) if $U_x=5$ V.

Switching $U_x$ to 0 V (using the microprocessor of the radio, for example), narrowed bandwidth and improved adjacent channel selectivity is provided for 12.5 kHz channel spacing systems (for example).

Referring to FIGS. 2A and 2B, it may be seen the improvement in selectivity with the impedance network (Z1 and Z2) switched in are as follows (for Y2 only): (static selectivity)

| @ −10 kHz: 2dB | +10 kHz: 3dB |
| @ −12.5 kHz: 6dB | +12.5 kHz: 7dB |
| @ −15 kHz: 11dB | +15 kHz: 20dB |

It will be understood these figures are indicative of the benefits of the present invention, but are not definitive or limiting of the scope of the invention.

FIG. 1 also shows optional components Z3–Z6 which can be used to provide variations in the operation/performance of the crystal filter circuit 18. For example, an impedance Z3 can be connected between node 30 and node 31. This improves selectivity and dynamic range for the wide bandwidth case, with first and second impedances Z1 and Z2 shunted to ground via Z3 and $Ux=+5$ V. When $Ux=0$ V, optional impedance Z3 does not affect the narrow bandwidth selectivity improvement of FIG. 2B.

An impedance Z4 may also be provided, coupled between node 30 and ground, permitting more flexibility in the values of first and second impedances Z1 and Z2 if required. Impedance Z5 coupled between the input and output ports 22 and 24 of the filter 18 can be used as a 'gimmick' impedance instead of impedance Z3 to improve selectivity in the wide bandwidth case when $Ux=+5$ V.

Impedance Z6 can be used to adjust the symmetry of the crystal filter response, especially if impedances Z1 to Z5 are inductors. If required, impedance Z6 may also be enabled/disabled to the crystal filter 20 via an electronic switch (not shown) connected in parallel with Z6.

It will be appreciated that the embodiments shown in FIG. 3 and 4 may also comprise such optional components Z3–Z6 coupled as shown in FIG. 1: the embodiment of FIG. 3 would preferably comprise capacitors C3–C6 (not shown therein) and the embodiment of FIG. 4 would preferably comprise inductors L3–L6 (not shown therein).

I claim:

1. An IF crystal filter for a radio receiver including:
   a first crystal filter characterized by a frequency response, and having an input and an output;
   a reactive impedance means coupled between the first crystal filter input and output thereof, for selectively adjusting the frequency response of the first crystal filter;
   switching means, operably coupled to said reactive impedance means, for enabling the reactive impedance means to selectively adjust the frequency response of the first crystal filter, wherein the switching means has a control input responsive to a control voltage;
   the reactive impedance means further comprises a network of a first impedance coupled to a second impedance defining a connecting node coupled to ground/reference potential via the switching means;
   a third impedance coupled between said connecting node and the switching means; and
   a fourth impedance coupled between said connecting node and ground potential.

2. An IF crystal filter for a radio receiver including:
   a first crystal filter characterized by a frequency response, and having an input and an output;
   a reactive impedance means, coupled between the first crystal filter input and output thereof, for selectively adjusting the frequency response of the first crystal filter;
   switching means, operably coupled to said reactive impedance means, for enabling the reactive impedance means to selectively adjust the frequency response of the first crystal filter, wherein the switching means has a control input responsive to a control voltage;
   the reactive impedance means further comprises a network of a first impedance coupled to a second impedance defining a connecting node coupled to ground/reference potential via the switching means; and
   an impedance coupled between said connecting node and ground potential.

3. An IF crystal filter for a radio receiver including:
   a first crystal filter characterized by a frequency response, and having an input and an output;
   a reactive impedance means, coupled between the first crystal filter input and output thereof, for selectively adjusting the frequency response of the first crystal filter;
   switching means, operably coupled to said reactive impedance means, for enabling the reactive impedance means to selectively adjust the frequency response of the first crystal filter, wherein the switching means has a control input responsive to a control voltage;
   the reactive impedance means further comprises a network of a first impedance coupled to a second impedance defining a connecting node coupled to ground/reference potential via the switching means; and
   another impedance coupled between the input and the output of the first crystal filter.

4. An IF crystal filter for a radio receiver including:
   a first crystal filter characterized by a frequency response, and having an input and an output;
   a reactive impedance means, coupled between the first crystal filter input and output thereof, for selectively adjusting the frequency response of the first crystal filter;

switching means, operably coupled to said reactive impedance means, for enabling the reactive impedance means to selectively adjust the frequency response of the first crystal filter, wherein the switching means has a control input responsive to a control voltage;

the reactive impedance means further comprises a network of a first impedance coupled to a second impedance defining a connecting node coupled to ground/reference potential via the switching means; and a third impedance coupled between said connecting node and the switching means.

5. The IF crystal filter of claim 4 further comprises a second crystal that is coupled to the first crystal via a buffer amplifier.

6. In the IF crystal filter of claim 4, wherein the first impedance and the second impedance further comprise a first capacitor and a second capacitor, respectively.

7. In the IF crystal filter of claim 4, wherein the first impedance and the second impedance further comprise a first inductor and a second inductor, respectively.

8. In the IF crystal filter of claim 4, wherein the switching means further comprises a PIN diode, coupled between the connecting node and the ground/reference potential, wherein the PIN diode defines a variable impedance path to ground.

* * * * *